United States Patent [19]

Martinson et al.

[11] Patent Number: 5,587,916

[45] Date of Patent: Dec. 24, 1996

[54] LOW VOLTAGE SENSING CIRCUITS FOR BATTERY POWERED DEVICES HAVING A MICRO-PROCESSOR

[75] Inventors: Glen D. Martinson, Oakville, Canada; Stephen T. Makk, Conyers, Ga.

[73] Assignee: B.E.L.-Tronics Limited, Mississauga, Canada

[21] Appl. No.: 290,122

[22] Filed: Aug. 15, 1994

[51] Int. Cl.[6] ....................................................... G05F 1/08
[52] U.S. Cl. ........................................... 364/483; 323/224
[58] Field of Search ..................................... 364/483, 569; 324/416, 433; 136/290; 323/233, 224, 265, 284

[56] References Cited

U.S. PATENT DOCUMENTS

| | | | |
|---|---|---|---|
| 5,287,286 | 2/1994 | Ninomiya | 364/483 |
| 5,420,798 | 5/1995 | Lin et al. | 364/483 |
| 5,442,794 | 8/1995 | Wisor et al. | 364/483 |

OTHER PUBLICATIONS

Maxim Integrated Products catalogue, pp. 4–161 through 4–170.

*Primary Examiner*—Emanuel T. Voeltz
*Assistant Examiner*—Thomas Peeso
*Attorney, Agent, or Firm*—Donald E. Hewson

[57] ABSTRACT

A low voltage sensing circuit for a battery powered, micro-processor based circuit is provided. A standard voltage regulator has input voltage from a battery, and output voltage which is fed to a system requiring the same, which includes a micro-processor. A voltage divider is connected through a capacitor to an output port of the micro-processor; and the common point of the voltage divider is connected to the base or emitter of a transistor. Periodically, there is an output pulse from the output port of the micro-processor, which pulse has a predetermined length. During the output pulse from the micro-processor, the transistor may become conductive while the capacitor is recharging. Depending of the configuration, the fact that the transistor is conductive is indicative that the input voltage is either below or above a predetermined value. The width of the pulse that is created across a resistor connected to the collector of the transistor and also to an input port of the micro-processor, is indicative of how much below or above the predetermined value the input voltage from the battery has deviated. The predetermined input voltage is established by setting the values of the resistors in the series connected voltage divider.

18 Claims, 2 Drawing Sheets

FIG 1

LOW VOLTAGE SENSING CIRCUITS FOR BATTERY POWERED DEVICES HAVING A MICRO-PROCESSOR

FIELD OF THE INVENTION

This invention relates to micro-processor based systems that are powered from a battery. Specifically, this invention relates to low voltage sensing circuits for such systems, by which an alarm or indication can be given when the battery voltage falls below a predetermined value. Methods of sensing low battery voltage, by employing transient conduction of a semiconductor device are also discussed.

BACKGROUND OF THE INVENTION

The use of battery powered, high technology appliances is becoming very common, both in the home and in the office, and in vehicles used to commute between the two. Examples include battery powered radar detectors; and other examples may include telecommunications or other devices such as portable dictating equipment, cordless telephones, cellular telephones, pagers, caller identity display devices, laptop computers, calculators, personal entertainment devices, and so on. In each of those instances, operation of the device is, at least to some extent, under the control of a micro-processor which is found within the device, and in which specific programs are embedded. Various functions and operating steps, self-checking operations, or even wake and sleep operations may be under the control of the micro-processor—which, itself, is capable of performing timing operations since it is a clock driven device. However, the continued ability of the device to perform its functions under the control of the micro-processor may, at least in part, depend on the voltage being delivered to the micro-processor and to other circuit elements. Indeed, attempted or continued operation of such a device with insufficient supply voltage could result in unpredictable or erroneous behaviour of a control micro-processor. Moreover, with active telephone devices, there may be a chance of failure of the transmitting portion of the device; or even worse, with the transmitter failing to comply with mandated transmission or energy emission standards and regulations.

In general, most such devices are designed, and the circuit components chosen, to operate at one particular voltage—very often, five volts—notwithstanding that the voltage from the battery which powers the device might vary depending on the nature and state of charge of the battery. Most such devices may draw their operating power from a rechargeable battery or a dry cell or cells, with a predetermined but nominal output voltage. For example, several dry cells or batteries having nominal voltages of from six volts to nine volts, may be used in some devices; while other devices are available which may be powered by only one or two dry cells, having an output voltage in the range of 1.2 to 3.0 volts.

Thus, there will be installed in the micro-processor based device a voltage regulator, whose purpose is to output the specific operating voltage for the device and its circuit components, no matter what the battery voltage may be, within certain limits. For example, a five volt voltage regulator may be installed whose purpose is to provide a five volt output from a nominal nine volt battery—whose terminal voltage might, in fact, range from just over nine volts down to about seven volts, or less, depending on its age and state of charge. However, should the battery voltage from that nine volt battery, for example, fall below some particular value beyond which the voltage regulator cannot be counted on to perform its function properly, then there must be some means whereby the operator of the device becomes aware of that fact so that the battery may be recharged or a new battery installed.

Moreover, and in any event as noted above, the battery voltage that is fed into the input port of the voltage regulator may be higher or lower than the output voltage from the voltage regulator, depending on the battery source and type of regulator. The following discussion is therefore directed to circuits whose operation will proceed and which will monitor the status of the battery voltage, whether that voltage is above or below the regulated voltage, depending on the particular circumstances of any specific circuit or the type of regulator being used.

SUMMARY OF THE INVENTION

The present invention provides circuits which will determine when the battery voltage falls below a predetermined value, whereby an alarm or other indication may be given. Moreover, the present invention, in certain variations thereof, provides means for determining how far below or above a preset or predetermined value the battery has deviated, thereby providing some indication as to the imminence of supply voltage failure.

In one sense, the present invention provides a method of sensing low voltage from a battery, which method comprises generation of an output voltage pulse of known fixed amplitude, which is substantially of the same amplitude as the regulated output voltage from a DC voltage conversion device. The output voltage pulse is capacitively coupled through a capacitor to a normally non-conductive semiconductor device, which will exhibit transient conduction during the pulse if the magnitude of the varying voltage from the battery, relative to the fixed amplitude of the voltage pulse, varies from a predetermined value.

In another sense, the present invention provides a low-voltage sensing circuit for a battery-powered device having a micro-processor and a voltage conversion device—which may be a DC to DC converter or voltage regulator, or otherwise, and which in any event has a regulated output DC voltage at a set value over a wide range of battery voltages, and where the DC voltage that is fed to the voltage conversion device may be above the output voltage or may be below the output voltage, depending on the type of DC voltage conversion device being used. In any event, an input direct current is fed to the input terminal of the DC voltage conversion device and an output direct current voltage is fed from the output terminal of the DC voltage conversion device to an input power terminal of the micro-processor, and also to one of the base or emitter of a PNP transistor. The DC voltage conversion device has a third terminal which is connected to the system ground.

The other of the base or emitter of the PNP transistor is connected to a common point in a series resistor voltage divider comprising a first resistor and a second resistor, and the collector of the PNP transistor is connected to one end of a third reference resistor, of which the other end is connected to the system ground. The end of the first resistor that is remote from the common point is connected to the battery voltage, the end of the second resistor that is remote from the common point is connected to one side of a capacitor, and the other side of the capacitor is connected to an output port of the micro-processor. Further, the collector of the PNP transistor is connected to an input port of the micro-processor.

The voltage at the output port of the micro-processor is periodically changed so that a voltage pulse is issued therefrom, which voltage pulse may temporarily cause the transistor to become conductive so that a voltage will then appear across the third resistor. The values of each of the first and second resistors are chosen so that conduction of the PNP transistor occurs during the time when the voltage pulse is output from the micro-processor whenever the battery voltage has a predetermined relationship to a predetermined voltage.

In broad terms, therefore, the present invention provides a low-voltage sensing circuit which is essentially benign, and which draws current from the battery which is the source of power for the device in which the low-voltage circuit is installed, only during the brief interval of time which occurs periodically when the circuit comes into action so as to determine whether the battery voltage has fallen below a predetermined value beyond which ongoing operation of the device being powered by the battery should be discontinued.

Indeed, in broad terms, the present invention relates to low-voltage sensing circuits for use in devices that utilize a logic circuit having equivalent functionality to a microprocessor.

Also, for ease of discussion hereafter, the DC voltage conversion device may be considered to be either a voltage regulator which has a higher input DC voltage ($V_{BATT}$) than its set output DC voltage ($V_{REG}$), or a DC—DC converter which has a lower input DC voltage ($V_{BATT}$) than its set output DC voltage ($V_{REG}$).

In one embodiment of the invention, the principle is that, by providing a voltage divider between the battery and a capacitor, the other side of which is connected to an output port from the micro-processor, and placing the base of a PNP transistor at the common point in the voltage divider with the emitter of the transistor connected to the regulated output voltage from a voltage regulator, with the collector of the transistor being connected to an input port of the micro-processor and also to a resistor which is connected to ground, then if the voltage at the output port is periodically reduced to zero, and the battery voltage is below a predetermined value which is determined by setting the values of the resistors in the voltage divider, then when the battery voltage is below the predetermined value and there is an outgoing pulse from the output port of the micro-processor, the transistor will become conductive at least for a short period of time whereby a pulse is generated. The presence of the pulse indicates that the battery voltage has fallen below the predetermined value; and the width of the pulse is indicative of how far below the predetermined value the battery voltage has fallen.

Accordingly, the present invention comprises a low voltage sensing circuit for a battery powered, micro-processor based circuit having a voltage regulator, wherein a direct current voltage from a battery is fed to a 3-port voltage regulator having an input terminal, an output terminal, and a third terminal connected to ground. In this embodiment, the output direct current voltage of the voltage regulator is lower than the battery voltage, and the output voltage from the voltage regulator is fed not only to the circuit components whose operation requires that voltage, but also for purposes of the present invention to the emitter of a PNP transistor as well as to an input power terminal of the micro-processor.

The base of the PNP transistor is connected to a common point in a series resistor voltage divider, which comprises a first resistor and a second resistor; and the collector of the PNP transistor is connected to one end of a third resistor, with the other end of the third resistor being connected to ground. The end of the first resistor that is remote from the common point in the series resistor voltage divider is connected to the battery voltage—i.e. the battery positive terminal; and the other end of the second resistor remote from the common point is connected to one side of a capacitor. The other side of the capacitor is connected to an output port of the micro-processor. Moreover, the collector of the PNP transistor is also connected to an input power terminal of the micro-processor.

The voltage at the output port of the micro-processor is normally held at the same value as the output voltage of the voltage regulator, and the voltage at the input port of the micro-processor is held at zero volts with respect to ground.

Means are provided for periodically reducing the voltage at the output port of the micro-processor for a predetermined interval of time, to zero volts. Thus, as noted above, when the values of each of the first and second resistors are chosen so that, if the battery voltage falls below a predetermined value, then when the output voltage of the micro-processor output port is temporarily reduced to zero, the PNP transistor will become conductive for a period of time. When that happens, a voltage appears across the third resistor.

As noted, when the transistor becomes conductive, there is a voltage which appears across the third resistor as current flows through it, and that voltage appears as a voltage pulse at the input power terminal of the micro-processor. The width of the pulse will increase as the value of the battery voltage to the voltage regulator decreases.

Still further, there may be included in the micro-processor an appropriate means for determining the width of the voltage pulse across the third resistor, and thereby determining the amount by which the battery voltage $V_{BATT}$ which is input to the voltage regulator has fallen below the predetermined value.

In another embodiment of the invention, the principle is that, by providing a voltage divider between the battery and a capacitor, the other side of which is connected to an output port from the micro-processor, and placing the emitter of a PNP transistor at the common point in the voltage divider with the base of the transistor connected to the regulated output voltage from a DC—DC voltage converter, and also with the collector of the transistor being connected to an input port of the micro-processor and to a resistor which is connected to ground, then if the voltage at the output port is generally held at zero but periodically increased to the output voltage, then by setting the values of the resistors in the voltage divider the transistor will become conductive at least for a short period of time whereby a pulse across the third reference resistor is generated. If the values of the resistors of the voltage divider have been chosen properly, then provided the battery voltage $V_{BATT}$ that is input to the voltage regulator is above a predetermined value, then a voltage pulse will occur. If the voltage pulse does not occur, then the battery voltage has fallen below a predetermined value as established by the knowledge of the forward bias base to emitter voltage of the transistor and the settings of the resistors of the voltage divider, all as discussed in greater detail hereafter.

In general, the micro-processor is a CMOS device. Also, particularly when the micro-processor is a CMOS device, then it is such that the voltage which appears at an output port can swing from one rail, which is normally the output voltage of the voltage regulator, to the other rail, which is zero or ground, or which may be the output voltage of a DC—DC converter or at ground. In any event, the output port and the input port of the micro-processor may be two bits of any multi-bit port thereof, and they need not necessarily be bits of the same port.

BRIEF DESCRIPTION OF THE DRAWINGS

Embodiments of this invention will now be described by way of example in association with the accompanying drawings in which.

DETAILED DESCRIPTION OF THE PREFERRED EMBODIMENTS

Figure 1:
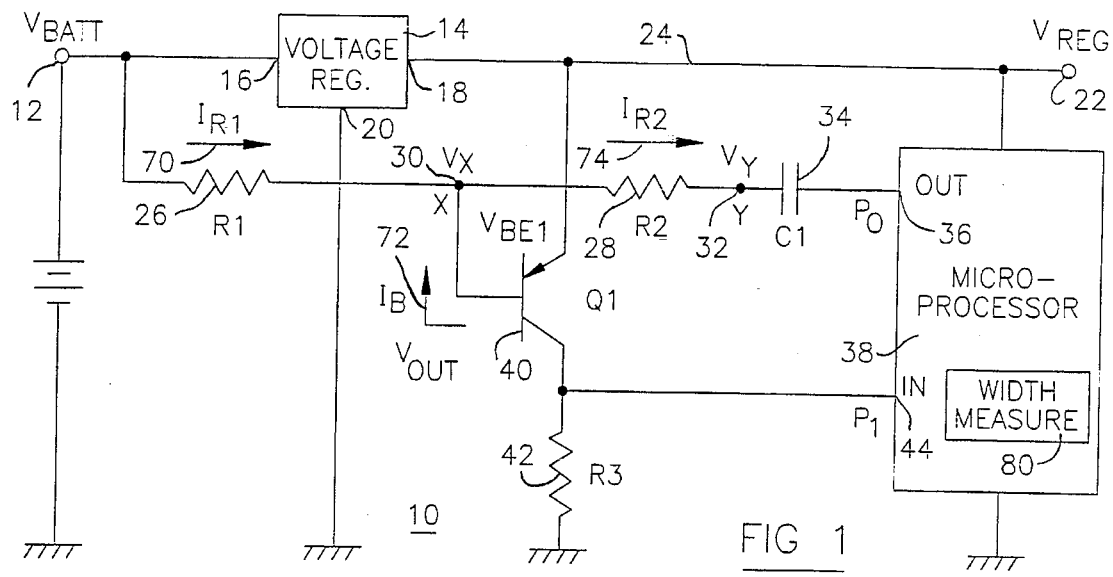
FIG. 1 is a representative circuit of a first embodiment of a low voltage sensing circuit in keeping with the present invention.
Figure 2:
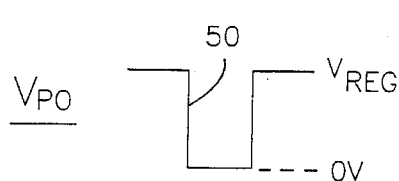
FIGS. 2, 3, 4, and 5 are a series of representative voltage traces, taken against time, showing representative voltages at various points throughout the circuit of FIG. 1.
Figure 6:
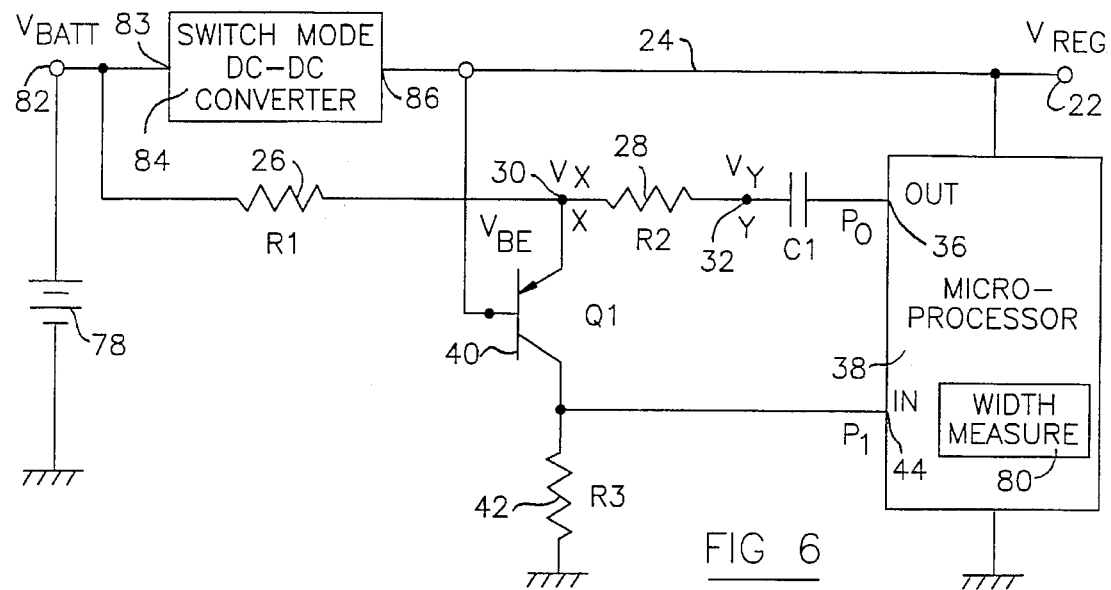
FIG. 6 is a representative circuit of a second embodiment of a low-voltage sensing circuit in keeping with the present invention.
Figure 7:
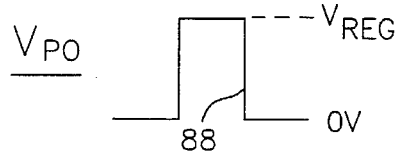
FIGS. 7, 8, 9, and 10 are a series of representative voltage traces, taken against time, showing representative voltages at various points throughout the circuit of FIG. 6.
Figure 9:
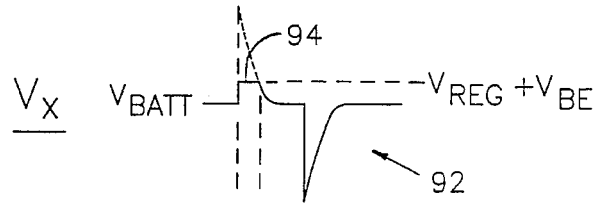

Throughout the following discussion, like reference numerals will be used, particularly with reference to the circuits of FIGS. 1 and 6, to indicate identical circuit components.

Reference will now be made to FIGS. 1 through 9.

The circuit of FIG. 1 is essentially a low cost circuit whose operation is efficient for sensing when low battery voltage occurs. The circuit 10 has an input terminal 12 at which voltage $V_{BATT}$ occurs. That voltage is, of course, the voltage from a battery which powers the low voltage sensing circuit and the battery operated, micro-processor based device in which it is found. The battery voltage is fed to a voltage regulator 14, which has an input port 16, an output port 18, and a third or reference port 20 which is connected to ground. The voltage $V_{REG}$ which appears at the output port 18 of voltage regulator 14 also appears at terminal 22, and is fed to a power supply rail or bus 24.

Also connected to terminal 12 is a resistor 26, designated $R_1$. Resistor 28 which is designated $R_2$, is connected in series with resistor 26. The resistors 26 and 28 form a voltage divider network, the common point 30 of which also has the designation X. The side of resistor 28 remote from point 30 is at 32, also designated Y; and it is connected to capacitor 34 which is designated $C_1$. The opposite side of capacitor 34 is connected to an output port 36 of a micro-processor 38, which output port is also designated $P_O$.

Connected to point 30 is the base of transistor 40, which transistor is also designated as $Q_1$; the emitter of which is connected to voltage output $V_{REG}$ from the voltage regulator 14. The collector of transistor 40 ($Q_1$), is connected to resistor 42, also designated $R_3$, the opposite end of which is connected to ground. The collector of transistor 40, is also connected to port 44 of the micro-processor 38, which port also carries the designation $P_1$.

It is noted that transistor 40 is shown as a PNP transistor. This is conventional, since the voltage output from the voltage regulator 14 is generally positive with respect to ground. Of course, it is possible that a negative voltage regulator could be used; in which case, an NPN transistor can be utilized having its emitter connected to the negative output voltage rail.

As noted above, the micro-processor 38 may generally be a CMOS device, which has the characteristic that the voltage at an output port thereof can swing from the positive rail of the voltage fed to the micro-processor to zero volts, under the control of program steps that are embedded within the micro-processor. Also, as noted above, micro-processor 38 may instead be a logic circuit or other logic system, which in any event would have equivalent functionality to a micro-processor.

Now, in order to detect whether or not the battery voltage $V_{BATT}$, which appears at terminal 12, is above or below a predetermined value that has been established, in keeping with the present invention the output port 36 of the micro-processor 38 will periodically have a negative going pulse which appears at that port. The pulse is shown at 50, in FIG. 2; and it is such that the value of the voltage at port 36 drops for the period of time of the pulse 50 from the value $V_{REG}$ to zero volts.

The width of the pulse 50 may be any convenient value, and typically is between three and four milliseconds—say, 3.5 milliseconds. Also, the pulse may occur at intervals of anywhere from about once per second up to about every 30 seconds or even once every minute. The supposition is made that battery voltage generally declines sufficiently slowly that testing its status needs only to be done relatively infrequently, as noted immediately above, or upon operator intervention and command. Moreover, the microprocessor can be programmed to change the sampling interval, depending on the activity of the device in which circuits according to the present invention are installed.

Of course, each time the output pulse 50 is delivered at port 36, this creates a transient charging current through the capacitor 34. On the other hand, the voltage across the capacitor 34 cannot change instantaneously—in its steady state, with no current flowing in the voltage divider 26, 28, there is a direct current voltage across the capacitor 34 from $V_{BATT}$ as it appears at terminal 12 and $V_{REG}$ as it appears at port 36. This means that the voltage $V_Y$, at point 32, must change from $V_{BATT}$ to ($V_{BATT}-V_{REG}$) when the port voltage at 36 drops from $V_{REG}$ to zero. When that happens, then there must be voltage change $V_{REG}$ which appears across the resistors 26, 28 (resistors $R_1$ and $R_2$), and that voltage appearing across the voltage divider gets divided proportionally in keeping with the following relationships:

$$V_{REG}=V_{R1}+V_{R2} \qquad \text{Eqn \#(1)}$$

where $V_{R1}$ is the voltage drop across resistor 26, and $V_{R2}$ is the voltage drop across resistor 28. Thus:

$$V_{R1} = V_{REG} \times \frac{R_1}{(R_1+R_2)} \qquad \text{Eqn \# (2)}$$

$$V_{R2} = V_{REG} \times \frac{R_2}{(R_1+R_2)} \qquad \text{Eqn \# (3)}$$

Now, at some instant in time, as discussed hereafter, the emitter to base junction of the transistor 40 will become forward biased and the transistor will conduct. However, before that happens, the voltage $V_X$ at the base of the transistor is as follows:

$$V_X = V_{BATT} - V_{R1} = V_{BATT} - V_{REG} \times \frac{R_1}{(R_1+R_2)} \qquad \text{Eqn \# (4)}$$

Now, whenever the outgoing negative pulse 50 occurs at port 36, the voltage $V_X$ at point 30 undergoes an initial voltage transition as defined in Equation (4), above. However, as the battery discharges and its terminal voltage begins to drop, the value of the voltage $V_X$ at point 30 will fall, and sooner or later it will fall below the value of voltage $(V_{REG}-V_{BE1})$—where $V_{BE1}$ is the forward bias junction drop across the base/emitter junction of transistor 40.

Figure 3:
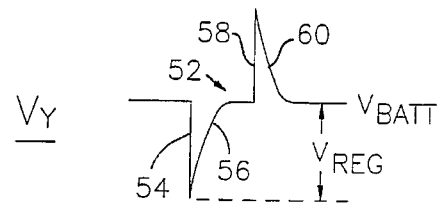

However, when the base voltage $V_X$ of the transistor 40 attempts to fall below the value of $(V_{REG}-V_{BE1})$, then the emitter to base junction of the transistor 40 becomes forward biased and clamps voltage $V_X$ at $(V_{REG}-V_{BE1})$, and the transistor 40 turns on—that is, it becomes conductive. This is described with reference to FIGS. 3, 4, and 5, as follows:

When the outgoing negative pulse 50 first occurs, the voltage $V_Y$ at point 32 exhibits a voltage swing as shown by curve 52 in FIG. 3. There is first a negative drop at 54, followed by a curve 56 which describes the voltage characteristic as the capacitor 34 once again recharges and the voltage across it changes. A further spike occurs at 58, followed by curve 60, when the pulse 50 stops and the voltage at port 36 returns to $V_{REG}$.

However, the voltage at $V_X$ cannot drop below the voltage $(V_{REG}-V_{BE1})$ because, as indicated above, at that point the transistor 40 becomes conductive. This is demonstrated in FIG. 4 at curve 62, where the voltage $V_X$ can only drop to a value indicated at 64.

Figure 4:
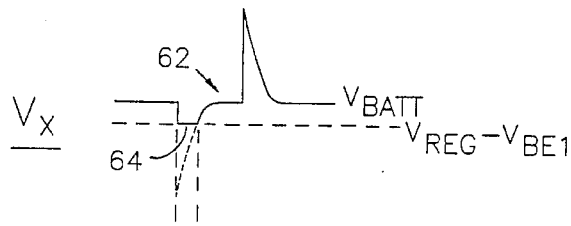
Figure 5:
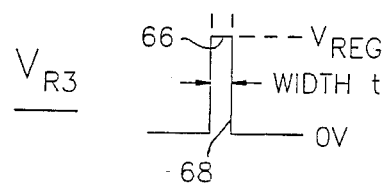

However, as soon as transistor 40 begins to conduct, then there is a current flow through resistor 42 for so long as the voltage $V_X$ remains at its value shown at 64 in FIG. 4. The current flowing through resistor 42 causes a voltage drop across it, indicated by $V_{R3}$ in FIG. 5, the value of which is shown at 66. This, of course, is a voltage pulse 68, whose width t is a non-linear function of the battery voltage $V_{BATT}$ and the passive network comprised of resistors 26 and 28, and capacitor 34 ($R_1$, $R_2$, and $C_1$).

The following discussion is directed to the manner in which the values of each of resistors 26 and 28 are chosen; and also, the manner by which the pulse width t of pulse 68 may be calculated is shown, whereby it can be determined how far below a predetermined value the battery voltage $V_{BATT}$ has fallen—it being understood that the predetermined value is that voltage at which the transistor 40 will become conductive when pulse 50 is output from port 36 of micro-processor 38.

Thus, the values of the resistors 26 and 28 are chosen such that the transistor 40 will conduct when the battery voltage drops to the predetermined value which is designated $V_{INLOW}$, and a pulse 50 is output at 36. In order for the transistor 40 to turn on, of course it is necessary that the voltage $V_X$ at point 30 must be less than the output voltage from the voltage regulator 14—which value appears also as the magnitude of pulse 50—minus the base to emitter voltage of the transistor 40. In other words, $V_X$ must be less than $(V_{REG}-V_{BE1})$, where $V_{BE1}$ is the forward bias base to emitter voltage drop across transistor 40. A typical value for voltage $V_{BE1}$ for a PNP transistor would be about 0.6 volts. The general expression for the value of voltage $V_X$ at point 30 to be such that transistor 40 will become conductive is expressed as:

$$V_X < V_{REG} - V_{BE1} \qquad \text{Eqn \#(5)}$$

Thus, taking the conditions of Equation (4), above, we get:

$$V_{INLOW} - V_{REG} \times \frac{R_1}{(R_1+R_2)} < V_{REG} - V_{BE1} \qquad \text{Eqn \# (6)}$$

-continued $$V_{INLOW} - V_{REG} - V_{BE1} + V_{REG} \times \frac{R_1}{(R_1+R_2)} \qquad \text{Eqn \# (7)}$$

$V_{INLOW}$ may be set, and the value $R_1$ of resistor 26 may be arbitrarily chosen, so that with the knowledge of what the output voltage $V_{REG}$ of voltage regulator 14 is, and the base to emitter voltage drop $V_{BE1}$ across transistor 40 is known, then Equation (7) can be solved for the value $R_2$ of resistor 28. With those values, then, a voltage pulse 68 will appear across resistor 42 whenever the battery voltage $V_{BATT}$ falls below $V_{INLOW}$.

When the transistor 40 becomes conductive, then as noted in FIG. 4, the base voltage $V_X$ becomes clamped at $V_{REG}-V_{BE1}$. Moreover, also as noted in FIG. 3, transistor 40 will remain on or conductive until such time as the base voltage $V_X$ rises above the value $V_{REG}-V_{BE1}$. Moreover, for so long as the transistor 40 is conductive, as noted above there will be a voltage pulse 68 across resistor 42; and it follows that the width of the pulse 68—width t—depends on the level of the voltage $V_{BATT}$. It also follows that the lower the value of the voltage $V_{BATT}$ becomes, the longer will be the duration of pulse 68 (width t).

Now, when transistor 40 is conducting, the Kirchoff Current Law mandates that the current $I_{R1}$, shown at arrow 70, plus the current $I_B$ through the transistor 40, shown at arrow 72, is additive to form the current $I_{R2}$ shown at arrow 74, and is expressed below as:

$$I_{R1} + I_B = I_{R2} \qquad \text{Eqn \#(8)}$$

However, since the voltage at the base of transistor 40 is clamped to the value $(V_{REG}-B_{BE1})$, as shown in FIG. 4, when the transistor 40 is conducting, then the following expressions define the values for each of $I_{R1}$, $I_{R2}$, and $I_B$, as follows:

$$I_{R1} = \frac{(V_{BATT}-V_X)}{R_1} = \frac{V_{BATT}-(V_{REG}-V_{BE1})}{R_1} \qquad \text{Eqn \# (9)}$$

$$I_{R2} = \frac{V_X - (V_{BATT}-V_{REG})}{R_2} \times e^{-\frac{t}{R_2 C_1}} \qquad \text{Eqn \# (10)}$$

When the $Q_1$ base to emitter junction conducts, then $V_X$ is equal to $(V_{REG}-V_{BE1})$, and hence:

$$I_{R2} = \frac{2V_{REG}-V_{BATT}-V_{BE1}}{R_2} \times e^{-\frac{t}{R_2 C_1}} \qquad \text{Eqn \# (11)}$$

Also, since $I_B = I_{R2} - I_{R1}$, then $$I_B = \frac{2V_{REG}-V_{BATT}-V_{BE1}}{R_2} \times e^{-\frac{t}{R_2 C_1}} - \qquad \text{Eqn \# (12)}$$

$$\frac{V_{BATT}-V_{REG}+V_{BE1}}{R_1}$$

Of course, the transistor 40 remains conductive until the base current $I_B$ reduces to zero. As the capacitor charges to the voltage $V_{BATT}$, the voltage $V_Y$ also moves towards the voltage $V_{BATT}$, so that when the capacitor 34 is fully charged the voltage across it is equal to the voltage $V_Y$ at point 32, which is equal to the voltage $V_{BATT}$ since no current is flowing through resistors 26 and 28. It follows that as the capacitor 34 is charging, the base current $I_B$ reduce to zero, at which time the transistor 40 stops conducting. Also, at that same time, when the current $I_B$ through the transistor 40 reduces to zero, then the voltage drop $V_{R3}$ across resistor 42 drops to zero. These relationships are, again, described in FIGS. 4 and 5.

It also follows, from the above, that the width t of the voltage pulse 68 increases as the voltage $V_{BATT}$ reduces. It is mathematically possible to specifically solve Equation (12) for the value of t, by setting $I_B$ to zero. This, of course, takes into account the time constant for charging the capacitor 34 established by the values of resistor 28 and the capacitor 34. The micro-processor can have an appropriate program embedded into it for that purpose.

Moreover, a width measurement means 80, comprising either software or dedicated hardware can be provided within the micro-processor 38, or elsewhere, which effectively is a clock or timer working from a relatively fast clock frequency to measure the width t of the voltage pulse 68 such as it appears at port 44. That being the case, then a look-up table or mathematical algorithm can be established within the micro-processor 38, whereby at least a rough indication can be given as to the amount that the battery voltage $V_{BATT}$ has fallen below the set voltage threshold $V_{INLOW}$.

Turning now to FIG. 6 and the curves of FIGS. 7 through 10, a similar circuit to that of FIG. 1 is shown except that, in this case, the voltage of battery 78, which appears at input terminal 82 and input port 83 of voltage regulator 84, is lower than the output voltage $V_{REG}$ which appears at output port 86. The voltage regulator is a switch mode DC to DC converter, usually a pulse width modulated (PWM) DC—DC convertor. Moreover, the output voltage $V_{REG}$ from the voltage boost regulator 84 appears at the base of the transistor 40, and the emitter of transistor 40 is connected to point 30 which is the common point X between resistors 26 and 28 in the voltage divider, which they form.

In this case, when the transistor 40 is in its quiescent state, the base-emitter junction of the transistor is reverse biased by the voltage ($V_{REG}-V_{BATT}$). Generally, the voltage at output port 36 of micro-processor 38 is held at zero volts, but periodically it is increased to voltage $V_{REG}$ as shown in voltage pulse 88 of FIG. 7. Then, there will result a step change in voltage of $V_{R1}$ which is represented by Equation #2, and which is shown below as Equation #13.

$$V_{R1} = V_{REG} \times \frac{R_1}{(R_1 + R_2)} \qquad \text{Eqn \# (13)}$$

Figure 8:
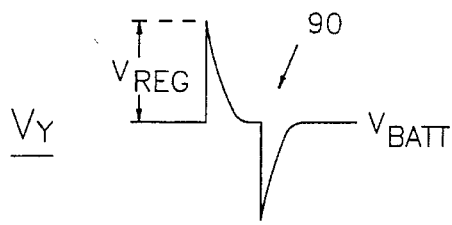

This voltage will forward bias the transistor 40 if the step change in voltage is greater than the existing reverse bias voltage by an amount equal to voltage $V_{BE}$, which is the forward bias base to emitter voltage of 40. Thus, if:

$$V_{REG}\frac{R_1}{R_1 + R_2} > (V_{REG} - V_{BATT}) + V_{BE} \qquad \text{Eqn \# (14)}$$

or, in other words, if:

$$V_{BATT} > V_{BE} + V_{REG}\frac{R_2}{R_1 + R_2} \qquad \text{Eqn \# (15)}$$

then, transistor 40 will conduct, and the voltage $V_Y$ at point 32 will exhibit a voltage swing as shown by curve 90 in FIG. 8. However, as before, the voltage $V_X$ at point 30 cannot increase beyond the value of ($V_{REG}+V_{BE}$), as shown in curve 92 in FIG. 9. In any event, if transistor 40 becomes conductive and saturates, then its collector voltage will actually exceed the supply voltage $V_{REG}$ by the amount of voltage $V_{BE}$ as shown at 94 in FIG. 9—assuming that the collector and emitter voltages are equal when the transistor saturates.

Saturation of transistor 40 will occur even for slight forward bias voltage of the base emitter junction of transistor 40, if the value $R_3$ of resistor 42 is much greater than the value of the parallel combination of resistors 26 and 28 ($R_1$ and $R_2$), as shown below where $R_1//R_2$ is the parallel combination of $R_1$ and $R_2$:

$$R_3 >> R_1//R_2 \qquad \text{Eqn. \#(16)}$$

The positive going pulse 96 at the collector of transistor 40 can be used to indicate when the battery voltage $V_{BATT}$ is greater than a set value as given by the expression of Equation #15, above.

Figure 10:
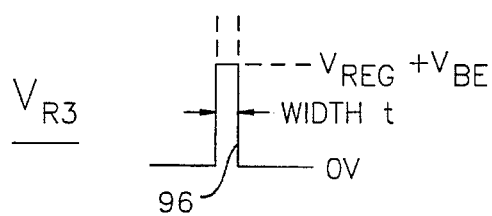

Moreover, as before, a pulse 96, as shown in FIG. 10, appears across resistor 42. The width of the pulse 96 is indicative of the amount by which the battery voltage $V_{BATT}$ is greater than the preset threshold. It follows that, so long as a pulse 96 occurs across resistor 42, the value of the battery voltage $V_{BATT}$ is greater than the limit below which the battery voltage from the battery 78 has fallen to a dangerous level, and beyond which operation of the device in which the low-voltage sensing circuit of FIG. 6 should be discontinued.

As before, the width of pulse 96 can be measured by the width measurement means 80 of micro-processor 38, whereby the amount by which the voltage $V_{BATT}$ is above the threshold voltage can be measured and determined.

It follows that the present invention also provides a method of sensing low battery voltage from the battery. As noted above, the battery voltage will vary over time, and thus there is a varying battery voltage from the battery to the circuit which comprises the micro-processor 38 and a DC voltage conversion device 14 or 84, each of which has a regulated output voltage. Moreover, the capacitor 34 capacitively couples the voltage pulse 50 or 88 output from the output port 36 of the micro-processor 38 to the transistor 40.

The magnitude of the output voltage pulse 50 or 88 is known, and is substantially equal to the regulated output voltage of the DC voltage conversion device 14 or 84. The transistor will exhibit transient conduction during the pulse 50 or 88, if the magnitude of the varying battery voltage, relative to the fixed amplitude of the output voltage pulse 50 or 88, varies from a predetermined amount. That amount is, of course, determined by the values of the resistors 26 and 28, as described above.

At the same time that the transistor is conductive, as described above, a transient pulse is impressed on the resistor 42 and on the input port 44 of the micro-processor 38. Of course, as described above, the width of the transient pulse can be used to determine the amount by which the magnitude of the varying battery voltage differs from the predetermined amount—above or below, also as discussed above.

What has been described particularly herein are low voltage sensing circuits whereby an indication can be given when the battery voltage from which a micro-processor based system or device is being powered, drops below a particular voltage which might be considered to be detrimental to the operation of the device, or below which the device or circuit components within it cannot be fully expected or even reasonably expected to operate in the designed or designated manner.

Moreover, the low voltage sensing circuits and method of the present invention provide several advantages over previous low voltage detectors. The first advantage is that the reference voltage by which a determination of imminent power supply failure may be made is, in fact, derived from the voltage regulator itself. No independent or reference voltage supply is required. As has been noted, the circuit is very small and inexpensive to produce, since it utilizes only a single transistor. Finally, operation of the present low voltage sensing circuit has the effect of actually permitting an extended battery life, since the circuits consume only negligible quiescent current for the most part, and only consumes dynamic current during the period of time that there is pulse being output from the micro-processor.

Other modifications and alterations may be used in the design and manufacture of the apparatus, or operation of the method, of the present invention without departing from the spirit and scope of the accompanying claims. It should be noted that it is not outside the scope of the appended claims to arrange the electrically complementary circuit and utilize an NPN transistor, as noted above; nor, indeed, to incorporate the circuits hereof into a voltage regulator module, a DC—DC converter module, or even into a logic system or subsystem, or even into a micro-processor module.

What is claimed is:

1. A low voltage sensing circuit for a battery powered device having a logic circuit or subsystem, and a voltage regulator; wherein an input direct current voltage from a battery is fed to a voltage regulator having at least an input terminal, an output terminal, and a third terminal connected to ground, wherein the output direct current voltage of said voltage regulator is lower than said input voltage and is fed to the emitter of a PNP transistor and to an input power terminal of a logic circuit or subsystem;

wherein the base of said PNP transistor is connected to a common point in a series resistor voltage divider comprising a first resistor and a second resistor, and the collector of said PNP transistor is connected to one end of a third reference resistor, the other end of which is connected to ground;

wherein the end of said first resistor that is remote from said common point is connected to said input voltage, the end of said second resistor that is remote from said common point is connected to one side of a capacitor, and the other side of said capacitor is connected to an output port of said logic circuit or subsystem;

wherein said collector of said PNP transistor is also connected to an input port of said logic circuit or subsystem;

wherein the voltage at said output port of said logic circuit or subsystem is normally held at said output voltage value, and the voltage at said input port is zero volts with respect to ground; and means for periodically reducing the voltage at said output port for a predetermined interval of time to zero volts;

wherein the values of each of said first and second resistors are chosen so that, if said input voltage falls below a predetermined value and when said output voltage of said output port of said logic circuit or subsystem is temporarily reduced to zero, said transistor becomes conductive and a voltage appears across said third resistor.

2. The low voltage sensing circuit of claim 1, wherein said logic circuit or subsystem is a micro-processor.

3. The low voltage sensing circuit of claim 2, wherein said micro-processor is a CMOS device.

4. The low voltage sensing circuit of claim 2, wherein said output port is one bit of a multi-bit port of said micro-processor, and said input port is another bit of said multi-bit port or one bit of another multi-bit port of said micro-processor.

5. The low voltage sensing circuit of claim 4, wherein, when said transistor is conductive, the voltage across said third resistor appears as a voltage pulse; and wherein the width of said voltage pulse increases as the value of said input voltage decreases.

6. The low voltage sensing circuit of claim 5, including means in said micro-processor for determining the width of said voltage pulse and thereby determining the amount that said input voltage has fallen below said predetermined value.

7. A low voltage sensing circuit for a battery powered device having a logic circuit or subsystem, and a voltage regulator; wherein an input direct current voltage from a battery is fed to a voltage regulator which is a switch mode DC—DC voltage converter having at least an input terminal, an output terminal, and a third terminal connected to ground, wherein the output direct current voltage of said voltage regulator is higher than said input voltage and is fed to the base of a PNP transistor and to an input power terminal of a logic circuit or subsystem;

wherein the emitter of said PNP transistor is connected to a common point in a series resistor voltage divider comprising a first resistor and a second resistor, and the collector of said PNP transistor is connected to one end of a third reference resistor, the other end of which is connected to ground;

wherein the end of said first resistor that is remote from said common point is connected to said input voltage, the end of said second resistor that is remote from said common point is connected to one side of a capacitor, and the other side of said capacitor is connected to an output port of said logic circuit or subsystem;

wherein said collector of said PNP transistor is also connected to an input port of said logic circuit or subsystem;

wherein the voltage at said output port of said logic circuit or subsystem is normally held at zero volts with respect to ground, and the voltage at said input port is also at zero volts with respect to ground; and means for periodically increasing the voltage at said output port for a predetermined interval of time to said output voltage;

wherein the value of the forward bias base to emitter voltage is known and the values of each of said first and second resistors are chosen so that, so long as said input voltage is above the value of a predetermined voltage when said output voltage of said output port of said logic circuit or subsystem is temporarily increased to said output voltage, said transistor becomes conductive and a voltage appears across said third resistor.

8. The low-voltage sensing circuit of claim 7, wherein said logic circuit or subsystem is a micro-processor.

9. The low voltage sensing circuit of claim 8, wherein said micro-processor is a CMOS device.

10. The low voltage sensing circuit of claim 8, wherein said output port is one bit of a multi-bit port of said micro-processor, and said input port is another bit of said multi-bit port or one bit of another multi-bit port of said micro-processor.

11. The low voltage sensing circuit of claim 10, wherein, when said transistor is conductive, the voltage across said third resistor appears as a voltage pulse; and wherein the width of said voltage pulse decreases as the value of said input voltage decreases.

12. The low voltage sensing circuit of claim 11, including means in said micro-processor for determining the width of said voltage pulse and thereby determining the amount that said input voltage is above said predetermined value.

13. A low voltage sensing circuit for a battery-powered device having a circuit or subsystem, and a DC voltage conversion device; wherein an input direct current voltage is fed to an input terminal of said DC voltage conversion device and an output direct current voltage is fed from an output terminal of said DC voltage conversion device to an input power terminal of a logic circuit or subsystem and to one of the base or emitter of a PNP transistor, and said DC voltage conversion device has a third terminal connected to the system ground;

wherein the other of said base or emitter of said PNP transistor is connected to a common point in a series resistor voltage divider comprising a first resistor and a second resistor, and the collector of said PNP transistor is connected to one end of a third reference resistor, the other end of which is connected to the system ground;

wherein the end of said first resistor that is remote from said common point is connected to said input voltage, the end of said second resistor that is remote from said common point is connected to one side of a capacitor, and the other side of said capacitor is connected to an output port of said logic circuit or subsystem;

wherein said collector of said PNP transistor is also connected to an input port of said logic circuit or subsystem;

wherein the voltage at said output port of said logic circuit or subsystem is periodically changed so as to issue a voltage pulse which may temporarily cause said transistor to become conductive so that a voltage appears across said third resistor; and wherein the values of each of said first and second resistors are chosen so that conduction of said PNP transistor occurs during said voltage pulse when said input voltage has a predetermined relationship to a predetermined voltage.

14. The low-voltage sensing circuit of claim 13, wherein said logic circuit or subsystem is a micro-processor.

15. A method of sensing low output voltage from a battery which supplies a varying input voltage over time to a battery powered device; wherein said battery powered device includes a logic circuit or subsystem, a DC voltage conversion device having a regulated output voltage, and a semiconductor circuit comprising a normally non-conductive semiconductor device together with other associated passive electrical components including resistors and a capacitor, and wherein said semiconductor circuit is connected to an output port of said logic circuit or subsystem;

wherein, during said methods, an output voltage pulse of known fixed amplitude is output from said output port of said logic circuit or subsystem, and is of substantially the same amplitude as said regulated output voltage from said DC voltage conversion device; and said output voltage pulse is fed to said semiconductor circuit;

wherein said semiconductor will exhibit transient conduction during said pulse if the magnitude of said varying input battery voltage relative to the fixed amplitude of said output voltage pulse varies from a predetermined value.

16. The method of claim 15, wherein said logic circuit or subsystem is a micro-processor.

17. The method of claim 16, wherein conduction of said normally non-conductive semiconductor device causes a transient pulse to be impressed upon an input port of said micro-processor.

18. The method of claim 17, wherein the width of said transient pulse is measured by width determination means to determine the amount by which the magnitude of said varying input battery voltage differs from said predetermined amount.

* * * * *